United States Patent [19]

Shiomi

[11] Patent Number: 4,894,079
[45] Date of Patent: Jan. 16, 1990

[54] METHOD AND APPARATUS FOR SUPPLYING GLASS FORMING RAW MATERIAL

[75] Inventor: Akio Shiomi, Yokohama, Japan

[73] Assignee: Sumitomo Electric Industries, Ltd., Osaka, Japan

[21] Appl. No.: 353,033

[22] Filed: May 17, 1989

[30] Foreign Application Priority Data

May 17, 1988 [JP] Japan ................. 63-118069

[51] Int. Cl.⁴ ........................... C03B 37/018
[52] U.S. Cl. ....................... 65/3.12; 65/3.2; 65/3.3; 65/12; 65/13; 65/18.2
[58] Field of Search ............ 65/3.12, 18.2, 3.2, 65/3.3, 12, 13

[56] References Cited

U.S. PATENT DOCUMENTS

| | | | |
|---|---|---|---|
| 4,389,229 | 6/1983 | Jang et al. | 65/3.12 |
| 4,421,540 | 12/1983 | Nakahara et al. | 65/18.2 X |
| 4,432,781 | 2/1984 | Okamoto et al. | 65/18.2 |
| 4,610,708 | 9/1986 | Sarhangi et al. | 65/3.12 |
| 4,707,173 | 11/1987 | Kawazoe et al. | 65/3.12 |
| 4,728,350 | 3/1988 | Cocito et al. | 65/3.12 X |
| 4,813,989 | 3/1989 | Uchiyama et al. | 65/3.12 X |

Primary Examiner—Arthur Kellogg
Attorney, Agent, or Firm—Cushman, Darby & Cushman

[57] ABSTRACT

In a method for supplying a glass forming raw material in a reactor which comprises bubbling a carrier gas into a liquid glass forming raw material contained in a container and supplying a mixture of the glass forming raw material and the carrier gas in the reactor, pressure of an atmosphere surrounding said container and said reactor is kept constant to supply a desired amount of the glass forming raw material to the reactor.

3 Claims, 2 Drawing Sheets

METHOD AND APPARATUS FOR SUPPLYING GLASS FORMING RAW MATERIAL

BACKGROUND OF THE INVENTION

1. Field of the Invention

The present invention relates to a method and an apparatus for supplying a glass forming raw material. More particularly, the present invention relates to a method and an apparatus for supplying a desired amount of a glass forming raw material into a reactor with good reproducibility. Typically, the glass forming raw material is one used for producing a glass preform from which an optical fiber is fabricated.

2 Description of the Related Art

The typical methods for producing a glass preform for use in the fabrication of an optical fiber include the inside vapor deposition method, the outside vapor deposition method and the vapor phase axial deposition method. In these methods, the glass forming raw material such as silicon tetrachloride ($SiCl_4$) and an additive for modifying a refractive index of the formed glass (e.g. germanium tetrachloride, phosphorus oxychloride and boron tribromide) are filled in raw material containers, respectively and then a carrier gas such as argon and helium is bubbled in the raw materials with controlling the flow rate of the carrier gas to evaporate the raw materials. After adjusting the saturation ratios of the raw material vapor, the mixture of the raw materials and the carrier gas is supplied into the reactor.

FIG. 1 schematically shows a conventional apparatus for supplying the glass forming raw material in a reactor. In this apparatus, the carrier gas is bubbled into the glass forming raw material 3 in a container 2 through a flow controller 1 for adjusting the flow rate of the carrier gas, and the evaporated gas is supplied in a reactor 4.

The flow rate m of the glass forming raw material can be calculated according to the following equation:

$$m = C \times M \times \frac{P_T}{P_0 - P_T} \quad (1)$$

wherein m is a flow rate of the glass forming raw material, C is a saturation coefficient, M is a flow rate of the carrier gas, T is a temperature of the container, $P_T$ is a vapor pressure of the glass forming raw material at the temperature T, and $P_0$ is a pressure of an atmosphere surrounding the container for the raw material and the reactor.

To keep the flow rate m of the glass forming raw material constant, all the variables in the right side of the equation (1) should be kept constant.

A technique for keeping the saturation coefficient C constant is disclosed in Japanese Patent Publication No. 1378/1986. According to this technique, two containers for the glass forming raw material are connected in series with a pipe for supplying the carrier gas, and the temperature of the first container is kept higher than that of the second container which is closer to the reactor. Such arrangement of the containers keeps the saturation coefficient C constant at about one (1) with good reproducibility. In addition, the temperature T of the container and the carrier gas flow rate M can be kept constant with a temperature regulator and a mass flow controller, respectively with good reproducibility.

However, according to the conventional method for supplying the glass forming raw material, the flow rate of the glass forming raw material changes delicately even if the saturation coefficient C, the carrier gas flow rate M and the container temperature T are kept constant. Thus, the flow rate of the glass forming raw material cannot be kept constant with good reproducibility.

SUMMARY OF THE INVENTION

One object of the present invention is to provide a method for supplying a desired amount of the glass forming raw material in the reactor with good reproducibility.

Another object of the present invention is to provide an apparatus for carrying out such method effectively.

These and other objects are accomplished by a method for supplying a glass forming raw material in a reactor, which method comprises bubbling a carrier gas into a liquid glass forming raw material contained in a container and supplying a mixture of the glass forming raw material and the carrier gas in the reactor, wherein pressure of an atmosphere surrounding said container and said reactor is kept constant, and an apparatus for supplying a glass forming raw material in a reactor, which apparatus comprises a container for containing a glass forming raw material, means for bubbling a carrier gas in the glass forming raw material, a pressure adjusting room in which said container and said reactor are installed and means for adjusting pressure in said pressure adjusting room so as to keep said pressure constant.

DETAILED DESCRIPTION OF THE DRAWINGS

The present invention is based on such finding that, in the conventional method for supplying the glass forming raw material, the flow rate m of the glass forming raw material varies with the change of atmospheric pressure. That is, in the equation (1), when the pressure $P_0$ of the atmosphere surrounding the container for the raw material and the reactor changes by $\Delta P_0$, the flow rate m of the glass forming raw material varies by $\Delta m$ according to the equation (2):

$$\Delta m = C \times M \times \left[ \frac{P_T}{P_0 - P_T} - \frac{P_T}{(P_0 + \Delta P) - P_T} \right] \quad (2)$$

Accordingly, to suppress the change $\Delta m$, the change $\Delta P$, namely the change of the pressure of atmosphere surrounding the raw material container and the reactor should be suppressed.

In the present invention, the pressure change $\Delta P$ is made smaller than $\pm 0.3\%$ or smaller than $\pm 2.25$ mmHg.

Now, the present invention is illustrates by making reference to the accompanying drawings by way of example.

Figure 1:
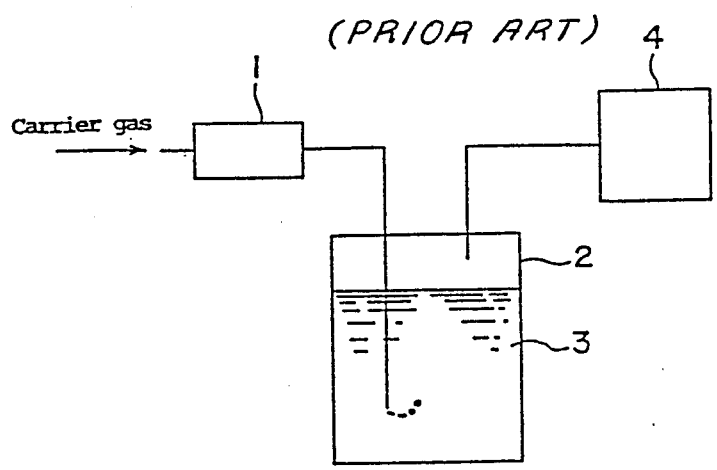
FIG. 1 schematically shows a conventional apparatus for supplying the glass forming raw material in a reactor.
Figure 4:
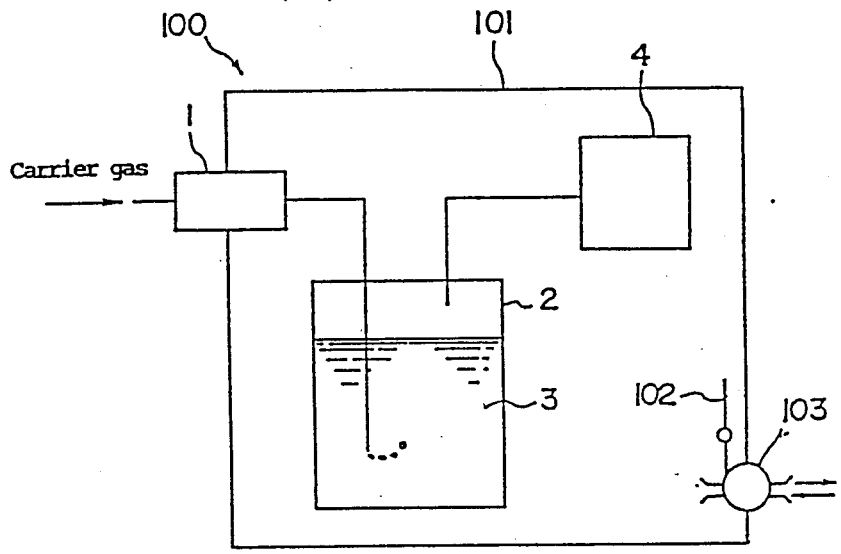
FIG. 4 schematically shows an apparatus of the present invention for supplying the glass forming raw material in a reactor.

In the apparatus 100 of FIG. 4, the flow controller 1, the container 2 for the glass forming raw material and the reactor 4 are the same as those of FIG. 1. In the apparatus 100, the flow controller 1, the container 2, the glass forming raw material 3 contained in the container 2 and the reactor are installed in a pressure adjusting room 101 which has air tightness to some extent. In addition, the apparatus 100 has a pressure sensor 102 which monitors the pressure in the room 101 and a pressure adjusting equipment 103 which adjusts the pressure in the room 101 to keep it constant. That is, the pressure in the pressure adjusting room 101 is measured by the pressure sensor 102, and the pressure value measured by the sensor 102 is fed to the pressure adjusting equipment 103. Then, the gas is evacuated from or injected in the room with the pressure adjusting equipment 103. Accordingly, the pressure in the room is kept constant when the pressure outside the room 101 changes due to, for example, approach of a low or high atmospheric pressure.

PREFERRED EXAMPLES OF THE PRESENT INVENTION

The present invention will be explained further in detail by following examples.

EXAMPLE AND COMPARATIVE EXAMPLE

In the apparatus of FIG. 4, a mass flow controller was used as the carrier gas flow controller 1.

Figure 5:
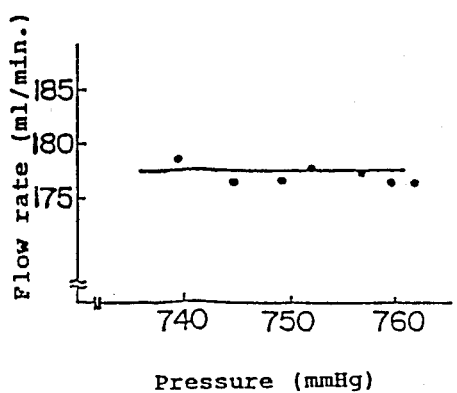
FIG. 5 is a graph showing variation of the transported amount of the glass forming raw material against variation of atmospheric pressure according to the present invention.

Argon gas as the carrier gas was flowed at a flow rate of 200 ml/min. through the controller 1 and bubbled in silicon tetrachloride as the glass forming raw material contained in the container 2 which was kept at 36.0° C. Then, the mixture of argon gas and evaporated silicon tetrachloride was supplied in the reactor 4 while varying the pressure outside the room 101 from 740 mmHg to 760 mmHg, and the flow rate of the glass forming raw material was measured in the reactor 4. The results are shown in FIG. 5. In this case, the pressure change in the reactor was $\pm 2.0$ mmHg or less.

For comparison, the same experiment was carried out with using the apparatus of FIG. 1. The results are shown in FIG. 2.

Figure 2:
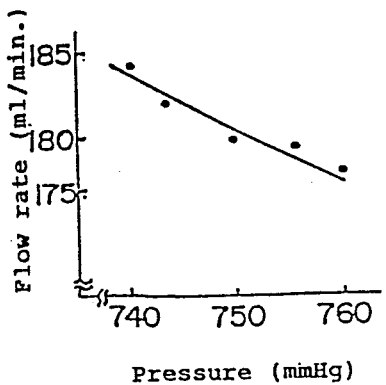
FIG. 2 is a graph showing variation of the transported amount of the glass forming raw material against variation of atmospheric pressure.

As understood from the results shown in FIGS. 2 and 5, the flow rate of the glass forming raw material changes when the atmospheric pressure changes in the conventional apparatus, while the flow rate of the glass forming raw material can be kept constant when the atmospheric pressure changes.

With using the apparatus of FIG. 4 for supplying glass forming raw material, a soot glass preform was produced under following conditions:

Flow rate of argon as the carrier gas of $SiCl_4$: 200 ml/min.

Flow rate of argon as the carrier gas of $GeCl_4$: 130 ml/min.

Temperature of the $SiCl_4$ container: 36° C.

Temperature of the $GeCl_4$ container: 23° C.

Flow rate of oxygen: 6 l/min.

Flow rate of hydrogen: 3 l/min.

Then, the soot preform was consolidated to produce a transparent glass preform.

Figure 6:
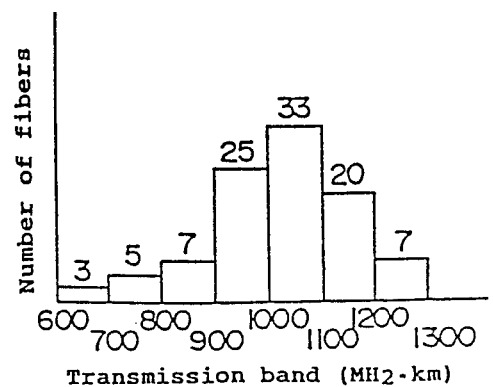
FIG. 6 is a histogram showing the number of optical fibers in each transmission band according to the present invention.

From the transparent preform, 100 graded index type optical fibers were fabricated and their transmission bands at a wavelength of 1.3 $\mu$m were examined. The results are shown in FIG. 6.

Figure 3:
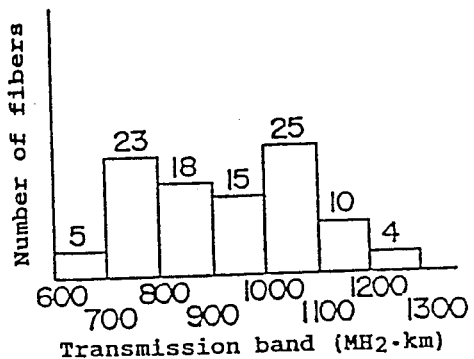
FIG. 3 is a histogram showing the number of optical fibers in each transmission band.

With using the apparatus of FIG. 1, 100 graded index type optical fibers were produced in the same manner as above. The transmission bands of these optical fibers are shown in FIG. 3.

It is almost impossible to produce a plurality of optical fibers all of which have the same performances, since many factors other than the atmospheric pressure influence the transmission bands of the optical fibers. Nevertheless, distribution of the transmission bands of the optical fibers produced according to the present invention is much smaller than that in the conventional method.

What is claimed is:

1. A method for supplying a glass forming raw material in a reactor, which method comprises bubbling a carrier gas into a liquid glass forming raw material contained in a container and supplying a mixture of the glass forming raw material and the carrier gas in the reactor, wherein pressure of an atmosphere surrounding said container and said reactor is kept constant.

2. The method according to claim 1, wherein change of the pressure of the atmosphere surrounding said container and said reactor is suppressed within 0.3%.

3. An apparatus for supplying a glass forming raw material in a reactor, which apparatus comprises a container for containing a glass forming raw material, means for bubbling a carrier gas in the glass forming raw material, a pressure adjusting room in which said container and said reactor are installed and means for adjusting pressure in said pressure adjusting room so as to keep said pressure constant.

* * * * *